United States Patent [19]

Schober et al.

[11] Patent Number: 5,552,263
[45] Date of Patent: Sep. 3, 1996

[54] PROCESS FOR PREPARING FLEXOGRAPHIC PRINTING PLATES

[75] Inventors: Manfred Schober, Offenbach; Hans-Leander Schröder, Reinheim, both of Germany

[73] Assignee: E. I. Du Pont de Nemours and Company, Wilmington, Del.

[21] Appl. No.: 427,299

[22] Filed: Apr. 24, 1995

Related U.S. Application Data

[63] Continuation of Ser. No. 980,146, Nov. 23, 1992, abandoned, which is a continuation of Ser. No. 635,918, Dec. 28, 1990, abandoned.

[30] Foreign Application Priority Data

Mar. 8, 1990 [DE] Germany .......................... 40 07 248.7

[51] Int. Cl.$^6$ ................................. G03F 7/38; G03F 7/40
[52] U.S. Cl. ............................................. 430/306; 430/309
[58] Field of Search ..................................... 430/309, 306, 430/328

[56] References Cited

U.S. PATENT DOCUMENTS

| | | | |
|---|---|---|---|
| 3,408,191 | 10/1968 | Jeffers | 96/28 |
| 3,951,657 | 4/1976 | Recchia et al. | 430/306 |
| 4,046,071 | 9/1977 | Mizuno et al. | 101/395 |
| 4,101,324 | 7/1978 | Mizuno et al. | 96/36.3 |
| 4,162,919 | 7/1979 | Richter et al. | 96/87 |
| 4,197,130 | 4/1980 | Nakamura et al. | 430/286 |
| 4,320,188 | 3/1982 | Heinz et al. | 430/281 |
| 4,394,435 | 7/1983 | Farber et al. | 430/287 |
| 4,430,417 | 2/1984 | Heinz et al. | 430/286 |
| 4,452,879 | 6/1984 | Fickes et al. | 430/309 X |
| 4,478,931 | 10/1984 | Fickes et al. | 430/309 X |
| 4,600,667 | 7/1986 | Uchida | 430/22 |
| 4,618,550 | 10/1986 | Uchida | 430/11 |
| 4,894,315 | 1/1990 | Feinberg et al. | 430/306 |
| 4,927,723 | 5/1990 | Cusdin | 430/306 |
| 4,940,650 | 7/1990 | Kurtz et al. | 430/283 |
| 5,015,556 | 5/1991 | Marters | 430/309 X |
| 5,135,837 | 8/1992 | Swatton | 430/306 |
| 5,354,645 | 10/1994 | Schober et al. | 430/306 |

OTHER PUBLICATIONS

Flexography Principles and Practices, Fourth Edition, pp. 130–134, Foundation of Flexographic Technical Association, Ronkonkoma, New York, 2nd Printing, 1992, Library of Congress Catalog Card No. 91-71436.

*Primary Examiner*—Cynthia Hamilton

[57] ABSTRACT

A process for preparing flexographic printing plates wherein the photopolymerizable material is imagewise exposed from the cover layer side, followed by an overall exposure through the support. The resulting flexographic printing plate has improved relief depths and a lower tonal value increase on printing.

6 Claims, No Drawings

PROCESS FOR PREPARING FLEXOGRAPHIC PRINTING PLATES

This is continuation of application Ser. No. 07/980,146 filed Nov. 23, 1992, now abandoned, which was a continuation of Ser. No. 07/635,918 filed on Dec. 28, 1990, abandoned.

FIELD OF INVENTION

This invention relates to a process for preparing flexographic printing plates, and in particular, to a process that produces flexographic printing plates which result in prints having significantly improved resolution.

BACKGROUND OF THE INVENTION

Flexographic printing plates are prepared using photopolymerizable recording materials on which the printing surface is produced by exposing imagewise a light-sensitive layer and removing the unexposed parts of the layer. Solid photopolymerizable materials can be differentiated from those in which the imagewise exposure is made on liquid systems. Following imagewise exposure, the photopolymerizable recording materials can then be developed in an aqueous or organic solvent system.

Examples of solid, solvent-developable recording materials are disclosed in DE-C3 22 15 090; U.S. Pat. Nos. 4,197,130; 4,320,188, and 4,430,417. Such materials usually consist of a support, an optional adhesive or other base coating, a solid, photopolymerizable layer and a cover element, consisting of a flexible polymer film that can be removed by the solvent developer, and a separable cover layer. The solid, photopolymerizable layer contains (1) at least one polymeric binder, (2) at least one ethylenically unsaturated compound that is addition-polymerizable by actinic light, and (3) a photoinitiator or photoinitiator system.

Printing plates can be prepared without a separate support. For example, DE-B 17 72 662 discloses the preparation of a printing plate with an integrated support from thick layers of photopolymerizable mixtures, particularly liquid mixtures. The plate is exposed overall on the side opposite the side that was imagewise exposed. The overall exposure can be made before, after, or simultaneously with the imagewise main exposure.

DE-C2 25 42 815 describes a process in which small projections are produced in the image-free areas by a backside exposure made through a screen before, after, or simultaneously with the imagewise exposure to prevent ink pickup in these areas.

DE-A 20 61 287 discloses a process for preparing gravure printing plates, in which one side is imagewise exposed and the other side is exposed through a screen. The printing surface of these gravure printing plates is the side that is exposed through the master screen.

U.S. Pat. No. 3,408,191 describes a process for the simultaneous preparation of positive and negative images by a peel-apart process. A photopolymerizable layer located between two supports is exposed imagewise through one support and exposed overall through the other support. The layered material is pulled apart and the positive image remains on the support that was exposed overall.

In preparing flexographic printing plates, the conventional practice has been to expose overall through the support before exposing imagewise from the cover layer side. See E Schulz, "Flexodruck von A bis Z", Polygraph, Frankfurt am Main, 1987, pages 92–94. The preliminary exposure step anchors the printing areas firmly to the support, builds a plate base, the so-called "floor", and increases sensitivity for the imagewise main exposure, as described in DE-C 12 14 085.

A disadvantage to using this conventional practice is that exposure latitude is clearly decreased. It is very difficult to achieve simultaneously good anchoring of the smallest dots in the highlights and adequate shadow relief depths of at least 100 µm in fine negative image elements for high resolution in printing. A very long exposure time is always necessary for complete polymerization of small dots. Consequently, the fine negative lines are frequently filled in by polymerization and the printing plate cannot be used.

Attempts to shorten or completely dispense with backside exposure in order to increase exposure latitude and to avoid polymerizing together the fine negative lines have shown that the smallest dots cannot be polymerized sufficiently. In fact, the dots can be deformed easily or even washed off in the development process. Missing smaller dots or merged negative lines are unacceptable for high quality printing. Very good image resolution in the highlights as well as shadows and accurate tonal value reproduction are very much required. Thus, a firm floor and consequently, uniform relief depth cannot be attained without backside exposure because these are affected by the intensity of the washoff process.

To fulfill these requirements, the preliminary exposure has been performed in practice until now through the support. See for example, U.S. Pat. No. 4,320,188 and EP-B1 00 84 851). In addition, attention has been concentrated on adhering accurately to the optimum exposure time that must be predetermined specifically for each plate type. Nevertheless, the production of useless printing plates cannot be avoided by this approach. Consequently, the preferred production of printing plates having improved printing quality employs methods that use a custom plate formulation for each special problem. Naturally, this increases development costs and moreover, requires maintaining a supply of many different photopolymerizable printing plates.

Various versions of exposure processes have also been proposed, but all are costly and require exacting operations. Thus, for many years, a technique was practiced in which fine negative lines are masked for part of the exposure time.

EP-A2 02 95 818 describes a process in which the photopolymerizable printing plate is exposed imagewise from the cover layer side through a negative and on the support side, through the corresponding positive. Thus, the floor is built up selectively in image-free areas. The positive and negative exposure can be performed simultaneously as well as in any desired sequence. To produce a printing plate by this process, two exposure masks, one positive and one negative, are required. In addition, exact registration positioning of the negative or positive is required.

EP-A3 01 69 294 discloses a process in which a liquid system is exposed imagewise from one side through a negative to form the printing surface and is exposed similarly imagewise on the other side through a second negative. However, the second negative has somewhat larger transparent areas than the first negative, so that the printing reliefs are anchored on a wider floor. The integrated support is formed, as is usual in liquid systems, by an overall backside exposure.

EP-A3 02 31 902 describes as process for preparing a continuously coated printing cylinder by heat-sealing the abutting edges of a printing plate mounted on the printing cylinder. In this case, the preliminary backside exposure is performed through a screen, because, on one hand, printing plates pre-exposed overall cannot then be heat-sealed, while, on the other hand, the preliminary exposure cannot be omitted for the above-stated reasons. In this manner, the layer remains heat-sealable.

Most currently known processes for improving the printing quality of flexographic printing plates are complicated, time-consuming, costly and frequently useful only for special problems.

Accordingly, the object of the present invention is to provide a process for preparing flexographic printing plates with which it is possible to obtain fast, simple and high quality printing with the smallest dots well anchored, fine negative lines completely defined, and very high image resolution on printing. In addition, dot growth and thereby, tonal value growth should be minimized and exposure latitude widened. Other properties of printing plates, such as, for example, their hardness or resiliency should not be affected adversely.

SUMMARY OF THE INVENTION

The invention relates to a process for preparing flexographic printing plates comprising:
(a) exposing imagewise a photopolymerizable recording material, comprising a support, a solid, photopolymerizable layer, and a cover layer, the imagewise exposure being made from the cover layer side, the photopolymerizable layer containing
  (1) at least one polymeric binder,
  (2) at least one ethylenically unsaturated compound that can be addition-polymerized by actinic light, and
  (3) a photoinitiator or an initiator system,
(b) removing the unexposed areas; and
(c) drying the printing plate,
wherein following step (a), the plate is overall exposed from the support side.

DETAILED DESCRIPTION OF THE INVENTION

The process of the invention comprises (a) exposing imagewise a photopolymerizable recording material comprising a support, a solid photopolymerizable layer, and a cover sheet, (b) removing the unexposed areas and drying the printing plate, followed by an overall exposure from the support side after imagewise exposure. The plate is exposed imagewise from the cover layer side. The photopolymerizable layer contains at least one polymeric binder, at least one ethylenically, unsaturated compound that can be addition-polymerized by actinic light, and a photoinitiator or photoinitiator system.

Following the imagewise exposure step, the plate is overall exposed through the support side.

Surprisingly and unexpectedly, it has been found that reversing the sequence of two known exposure steps, produces a flexographic printing plate with which significantly improved resolution can be achieved in printing. Backside preliminary exposure has been known for many years and has been regarded by the expert as absolutely necessary. The reversed exposure sequence of the invention achieves not only a multiple increase in exposure latitude for negative lines and highlight dots, but it also attains simultaneously a reduction in dot surface and a sharpening of dot shoulders, both of which are absolutely required for high quality printing. An additional advantage of the present process is that printing plates prepared by the process result in a much lower increase in tonal value, that is, a much lower enlargement of printed dots compared to dots in the original film, than with printing plates prepared by conventional exposure processes. Until now, such improvements could be obtained only by very expensive technical modifications in existing plate formulations.

A special advantage of the process of the invention is that it can be used for many known plate materials. Thus, it is possible to improve the quality of flexographic printing plates and the printing therefrom without having to adopt expensive and painstaking measures.

The present process can be used for photopolymerizable recording material containing at least one polymeric binder, at least one ethylenically unsaturated compound that can be addition polymerized by actinic light, and a photoinitiator or photoinitiator system. Examples of useful binders include polyamides, polyurethanes, polyesters, polyvinyl acetates, polyvinyl alcohols or homopolymers and copolymers from, for example, butadiene, isoprene, styrene, (meth)acrylonitrile, (meth)acrylic acid, and (meth)acrylic acid esters or amides. Binders that are especially suitable include thermoplastic elastomeric block copolymers as described, for example, DE-C 22 15 090, U.S. Pat. Nos. 4,320,188, 4,197, 130, 4,430,417, or 4,162,919, and polybutadienes and/or polyisoprenes as described, for example, in EP-A2 00 76 588. In particular, linear and radial block copolymers with polystyrene end blocks, such as, for example, polystyrene/polybutadiene/polystyrene, (polystyrene/polybutadiene)$_4$ Si or the corresponding isoprene polymers are suitable as binders. The average molecular weight of the block copolymers should be between 80,000 and 300,000, preferably between 100,000 and 250,000. A polystyrene proportion of 10–40% by weight is advantageous, however, a content of 15–30% by weight is especially advantageous.

Suitable ethylenically unsaturated compounds include the known monounsaturated or polyunsaturated monomers, such as, for example, esters or amides of acrylic acid or methacrylic acid with monofunctional or polyfunctional alcohols, amines, amino alcohols, hydroxy ethers and hydroxy esters. Mixtures of monounsaturated or polyunsaturated compounds as described in DE-C1 37 44 243 and DE-A 36 30 474 are also acceptable. Examples of the addition-polymerizable compounds include butyl acrylate, isodecyl acrylate, tetradecyl acrylate, 2-hexyloxyethyl acrylate, 1,4-butanediol diacrylate, 1,6-hexanediol dimethacrylate, trimethylol propane triacrylate, and dipentaaerythritol monohydroxy pentacrylate.

The photopolymerizable layers also contain photoinitiators or photoinitiator systems. Examples of photoinitiator or photoinitiator systems are alphamethyl benzoin, benzoin acetate, benzophenone, benzil dimethyl ketal, ethyl anthraquinone/4,4'-bis-(dimethylamino)benzophenone.

The photopolymerizable layer generally contains 60–95% by weight binder, 5–30% by weight monomer or monomer mixture, and 0.5–5% by weight initiator. Other additives, such as, for example, fillers, dyes, antioxidants, protectants against ozone, thermal polymerization inhibitors, and plasticizers can be present in the usual quantities. Preferred photopolymerizable layers have less than 5% by weight of a non-crosslinkable plasticizer; layers without such plasticizers are most particularly preferred.

Examples of suitable supports include various film-forming synthetic polymers. Polyester and polyester/polyamide sheets, which can be optionally provided with an adhesive layer or an antihalation layer, are used, especially polyethylene terephthalate sheets.

The cover layer used in the process of the invention can consist essentially of polystyrene, polyethylene, polypropylene or polyethylene terephthalate.

An elastomeric layer can be present between the photopolymerizable layer and the cover layer. The elastomeric layer contains at least one thermoplastic, elastomeric block copolymer. In addition, it can contain the compounds described in EP-B1 00 84 851. However, the elastomeric layer preferably contains a thermoplastic, elastomeric block copolymer with polystyrene end blocks, a thermoplastic polymer as a second binder, a dye, and optionally, additional auxiliary agents. Its layer thickness is 0.013 to 0.51 mm, preferably 0.025 to 0.127 mm.

A thin, non-adhesive polymer layer that can be removed by the developer solvent is located under the cover sheet. Polyamides, ethylene/vinyl acetate copolymers, or similar polymers that form transparent and tear-resistant films are preferred. The layer thickness is 0.0025 to 0.038 mm.

The photopolymerizable recording material can be prepared by the usual methods. However, the preferred method is to extrude and then calender the photopolymerizable composition between the support and a cover element. This method is described in EP-B1 00 84 851. The cover element can consist solely of a cover sheet or in addition, an elastomeric layer and/or a flexible polymer layer, as has already been described.

The thickness of the photopolymerizable recording material to be exposed in accordance with the process of the invention should be under 6 mm, preferably under 4 mm. Printing plates 1 to 3.5 mm thick are particularly preferred. However, plates with a thickness under 1 mm are also suitable for the process of the invention.

Imagewise exposure is conducted by the commonly used methods through a contact exposure mask. The cover sheet can be removed before or after imagewise exposure.

Actinic radiation of any origin and type can be used for preparing flexographic printing plates. Acceptable radiation sources include, for example, carbon arc lamps, mercury vapor lamps, incandescent lamps with special luminophores emitting ultraviolet light, argon incandescent lamps and photo lamps. However, the most suitable radiation source are mercury vapor lamps, especially ultraviolet light lamps and UV fluorescent lamps.

The step of overall backside exposure essential in the invention is performed following imagewise exposure. This exposure can be diffused or focused. All radiation sources customary for imagewise exposure can be used as exposure sources. The duration of the backside exposure is controlled by the desired thickness of the base to be formed. Exposure time is usually between one second and five minutes.

Washing off the non-photopolymerized areas of the printing plate can be accomplished with the usual developer solutions. However, the solvents disclosed in German Patent Application P 38 28 551.7 are preferred.

After drying at 40° to 75° C., the resulting printing plate can be optionally post treated chemically to eliminate surface tackiness, for example, with aqueous hypochlorite solution. In addition, the plate can be optionally post exposed. These two steps can be conducted in any sequence.

The following examples illustrate the invention. Unless otherwise stated, percents and parts cited in the examples are by weight.

EXAMPLES

Example 1

A commercial printing plate A described in more detail in the following was exposed in accordance with the process of the invention (inv), that is, the imagewise main exposure took place before the overall backside exposure. A second printing plate of Type A was given the standard exposure (sta). The exposures were made in a vacuum copying frame. The backside exposure lasted 45 seconds. The imagewise exposure was made through a screened original (48 lines/cm). The plates were then developed with a solvent and dried.

Printing plate A comprised a polyethylene terephthalate support, a photopolymerizable layer, a polyamide layer and a cover layer that was removed before imagewise exposure. The printing plate was 2.8 nun thick (without the cover layer). The photopolymerizable layer of printing plate A contained a binder of a polystyrene/polyisoprene/poly-styrene block copolymer as described in DE-C3 22 15 090 and a monomer mixture of 1,6-hexanediol acrylate and 1,6-hexanediol dimethyl acrylate.

The following characteristics of the finished printing form were determined for various main exposure times (ME) by measuring the corresponding micrographs (200× enlargement) and are shown in Table 1: shadow relief depth (SRD) of negative lines, dot diameter (D), dot surface (DS), and angle (A) of the dot shoulder (for 2% dots in each case). Dot diameter (D') and dot surface (DS') were also measured with the dots compressed about 25 μm. In addition, the following printing form properties were compiled in Table 9: exposure latitude (EL), utilization (U) of the maximum possible shadow relief depth without backside exposure, relief depth (R), the minimum exposure time (ME) necessary for anchoring 2% dots, and the dot shoulder angle at the maximum exposure time (MA) and dot surface (MS') at a compression of 25 μm. The values for the different exposure sequences (ES) were compared in each case.

As is clearly evident in Tables 1 to 7, the exposure sequence of the invention yields improvements for all of the plate types tested in exposure latitude, fine negative lines, and the size and form of the 2% dots.

TABLE 1

| ME (min) | ES | SRD (μm) | D (μm) | D' (μm) | DS (μm$^2$) | DS' (μm$^2$) | A (°) |
|---|---|---|---|---|---|---|---|
| 6 | inv | 147 | 20 | 45 | 314 | 1590 | 74 |
|   | sta | 193 | 30 | 60 | 706 | 2827 | 68 |
| 8 | inv | 133 | 20 | 45 | 314 | 1590 | 72 |
|   | sta | 136 | 30 | 60 | 706 | 2827 | 66 |
| 10 | inv | 117 | 25 | 45 | 490 | 1590 | 72 |
|   | sta | 81 | 35 | 75 | 962 | 4417 | 70 |
| 12 | inv | 115 | 25 | 55 | 490 | 2375 | 70 |
|   | sta | 42 | 40 | 75 | 1256 | 4417 | 52 |
| 14 | inv | 98 | 30 | 60 | 706 | 2827 | 67 |
|   | sta | 40 | 45 | 100 | 1590 | 7853 | 48 |
| 16 | inv | 86 | 30 | 60 | 706 | 2827 | 67 |
|   | sta | 33 | 45 | 100 | 1590 | 7853 | 36 |

Example 2

Two of the commercial plates B, described in more detail in the following, were treated as in Example 1 and tested. The backside exposure was 50 seconds. The layer structure and the thickness of printing plate B corresponded to plate Type A. The photopolymerizable layer contained a binder mixture of polystyrene/polybutadiene/polystyrene and polystyrene/polybutadiene block copolymers and a monomer mixture of 1,12-dodecyldiol diacrylate and 1,6-hexanediol dimethacrylate.

TABLE 2

| ME (min) | ES | SRD (μm) | D (μm) | D' (μm) | DS (μm²) | DS' (μm²) | A (°) |
|---|---|---|---|---|---|---|---|
| 6 | inv | 304 | 25 | 45 | 490 | 1590 | 70 |
|   | sta | 233 | 40 | 70 | 1256 | 3959 | 62 |
| 8 | inv | 246 | 25 | 45 | 490 | 1590 | 70 |
|   | sta | 158 | 45 | 70 | 1256 | 3959 | 58 |
| 10 | inv | 226 | 25 | 50 | 490 | 1963 | 66 |
|   | sta | 97 | 45 | 80 | 1590 | 5026 | 52 |
| 12 | inv | 178 | 35 | 50 | 962 | 1963 | 63 |
|   | sta | 65 | 45 | 95 | 1590 | 7088 | 47 |
| 14 | inv | 159 | 35 | 55 | 962 | 2375 | 63 |
|   | sta | 64 | 45 | 100 | 1590 | 7853 | 42 |
| 16 | inv | 120 | 35 | 55 | 962 | 2375 | 63 |
|   | sta | 60 | 45 | 100 | 1590 | 7853 | 42 |

Example 3

Two of the commercial plates C, described in more detail in the following, were treated as in Example 1 and tested. The backside exposure was 40 seconds. The layer structure corresponded essentially to plate Type A except for an elastomeric layer in accordance with EP-B1 00 84 851 between the photopolymerizable layer and the polyamide layer. The printing plate was 2.8 mm thick. The photopolymerizable layer contained the same binder as in Example 1, 1,6-hexanediol acrylate, and white petroleum oil as a plasticizer.

TABLE 3

| ME (min) | ES | SRD (μm) | D (μm) | D' (μm) | DS (μm²) | DS' (μm²) | A (°) |
|---|---|---|---|---|---|---|---|
| 6 | inv | 273 | 20 | 35 | 314 | 962 | 74 |
|   | sta | 284 | 30 | 50 | 706 | 1963 | 68 |
| 8 | inv | 238 | 20 | 45 | 314 | 1590 | 74 |
|   | sta | 229 | 35 | 55 | 962 | 2375 | 66 |
| 10 | inv | 224 | 25 | 45 | 490 | 1590 | 70 |
|   | sta | 218 | 35 | 65 | 962 | 3318 | 60 |
| 12 | inv | 217 | 25 | 45 | 490 | 1590 | 68 |
|   | sta | 197 | 35 | 75 | 962 | 4417 | 56 |
| 14 | inv | 196 | 25 | 45 | 490 | 1590 | 68 |
|   | sta | 190 | 35 | 75 | 962 | 4417 | 53 |
| 16 | inv | 188 | 25 | 45 | 490 | 1590 | 68 |
|   | sta | 165 | 35 | 75 | 962 | 4417 | 53 |

Example 4

Two of the commercial plates D, described in more detail in the following, were treated as in Example 1 and tested. The backside exposure was 45 seconds. The layer structure corresponded to plate Type A. The thickness was 3.1 mm. The photopolymerizable layer contained a mixture of syndiotactic 1,2-polybutadiene and cis-1,4-polyisoprene, as described in EP-A2 00 76 588.

TABLE 4

| ME (min) | ES | SRD (μm) | D (μm) | D' (μm) | DS (μm²) | DS' (μm²) | A (°) |
|---|---|---|---|---|---|---|---|
| 6 | inv | 206 | 20 | 35 | 314 | 962 | 73 |
|   | sta | 150 | 30 | 55 | 706 | 2375 | 65 |
| 8 | inv | 163 | 20 | 35 | 314 | 962 | 72 |
|   | sta | 108 | 30 | 55 | 706 | 2375 | 65 |

TABLE 4-continued

| ME (min) | ES | SRD (μm) | D (μm) | D' (μm) | DS (μm²) | DS' (μm²) | A (°) |
|---|---|---|---|---|---|---|---|
| 10 | inv | 155 | 25 | 40 | 490 | 1256 | 67 |
|   | sta | 70 | 35 | 65 | 962 | 3318 | 63 |
| 12 | inv | 144 | 25 | 45 | 490 | 1590 | 65 |
|   | sta | 67 | 35 | 70 | 962 | 3959 | 50 |
| 14 | inv | 135 | 25 | 45 | 490 | 1590 | 60 |
|   | sta | 65 | 35 | 70 | 962 | 3959 | 49 |
| 16 | inv | 121 | 25 | 50 | 490 | 1963 | 60 |
|   | sta | 64 | 35 | 70 | 962 | 3959 | 48 |

Example 5

Two of the commercial plates E, described in more detail in the following, were treated as in Example 1 and tested. The backside exposure was 45 seconds. The layer structure and thickness corresponded to plate Type A. The binder of the photopolymerizable layer contained a block copolymer of elemental elastomeric blocks as described in U.S. Pat. No. 4,430,417.

TABLE 5

| ME (min) | ES | SRD (μm) | D (μm) | D' (μm) | DS (μm²) | DS' (μm²) | A (°) |
|---|---|---|---|---|---|---|---|
| 6 | inv | 206 | 20 | 40 | 314 | 1256 | 68 |
|   | sta | 192 | 35 | 65 | 962 | 3318 | 62 |
| 8 | inv | 168 | 20 | 40 | 314 | 1256 | 68 |
|   | sta | 147 | 35 | 65 | 962 | 3318 | 60 |
| 10 | inv | 168 | 25 | 50 | 490 | 1963 | 65 |
|   | sta | 132 | 35 | 65 | 962 | 3318 | 52 |
| 12 | inv | 168 | 30 | 50 | 706 | 1963 | 62 |
|   | sta | 123 | 45 | 85 | 1590 | 5674 | 45 |
| 14 | inv | 142 | 30 | 55 | 706 | 2375 | 59 |
|   | sta | 91 | 45 | 105 | 1590 | 8659 | 32 |
| 16 | inv | 131 | 30 | 55 | 706 | 2375 | 58 |
|   | sta | 68 | 45 | 105 | 1590 | 8659 | 32 |

Example 6

Two of the commercial plates F, described in more detail in the following, were treated as in Example 1 and tested. The backside exposure was 80 seconds. The layer structure and thickness corresponded to plate Type A. The binder of the photopolymerizable layer contained a radial (polystyrene/polybutadiene)4Si as described in U.S. Pat. No. 4,197,130.

TABLE 6

| ME (min) | ES | SRD (μm) | D (μm) | D' (μm) | DS (μm²) | DS' (μm²) | A (°) |
|---|---|---|---|---|---|---|---|
| 6 | inv | 418 | 25 | 50 | 490 | 1963 | 70 |
|   | sta | 422 | 40 | 70 | 1256 | 3959 | 68 |
| 8 | inv | 385 | 30 | 50 | 706 | 1963 | 68 |
|   | sta | 364 | 40 | 70 | 1256 | 3959 | 67 |
| 10 | inv | 339 | 30 | 50 | 706 | 1963 | 68 |
|   | sta | 331 | 45 | 80 | 1590 | 5026 | 66 |
| 12 | inv | 265 | 30 | 50 | 706 | 1963 | 68 |
|   | sta | 241 | 45 | 80 | 1590 | 5026 | 66 |
| 14 | inv | 197 | 30 | 50 | 706 | 1963 | 65 |
|   | sta | 155 | 45 | 80 | 1590 | 5026 | 64 |
| 16 | inv | 183 | 30 | 60 | 706 | 1963 | 65 |
|   | sta | 122 | 50 | 80 | 1590 | 5026 | 62 |

Example 7

Two of the commercial plates G, described in more detail in the following, were treated as in Example 1 and tested.

The backside exposure was 4 seconds. The layer structure corresponded to plate Type C. The printing plate was 1.1 mm thick. The photopolymerizable layer contained the same binder as in Example 1 and 1,6-hexanediol diacrylate as monomer.

TABLE 7

| ME (min) | 6 | 8 | 10 | 12 | 14 | 16 |
|---|---|---|---|---|---|---|
| ES | inv\|sta | inv\|sta | inv\|sta | inv\|sta | inv\|sta | inv\|sta |
| SRD (μm) | 240\|239 | 219\|206 | 217\|183 | 210\|183 | 208\|159 | 183\|149 |

Example 8

Printing tests were conducted with printing forms of Types A, B, and C. Printing rate was 100 meters/minute and press contact pressure was 60 μm. A 40 μm thick polyethylene sheet was used as substrate. The alcoholic printing ink had a viscosity of 105 cps and was applied with an Anilox roller (150 1/cm and 6 grams/meter$^2$). The test results are compiled in Table 8. It is evident that the process of the invention can decrease considerably undesired tonal value growth in printing or can even prevent it completely.

TABLE 8

| Type | ES | Film Dot (%) | Printed Dot (%) | Dot Growth (%) | DS' (μm$^2$) |
|---|---|---|---|---|---|
| A | inv | 2 | 2 | 0 | 1590 |
|   | sta | 2 | 15 | 13 | 2827 |
| B | inv | 2 | 9 | 7 | 1963 |
|   | sta | 2 | 29 | 27 | 5026 |
| C | inv | 2 | 5 | 3 | 1590 |
|   | sta | 2 | 15 | 13 | 3318 |

TABLE 9

| Type | ES | EL (min) | U (%) | R (μm) | ME (min) | MS' (μm$^2$) | MA (°) |
|---|---|---|---|---|---|---|---|
| A | inv | 7 | 90 | 0.99 | 7 | 2827 | 75 |
|   | sta | 1 | 35 | 1.13 | 8 | 7853 | 40 |
| B | inv | 9 | 85 | 0.80 | 9 | 2375 | 63 |
|   | sta | 3 | 34 | 0.97 | 7 | 7853 | 42 |
| C | inv | 18 | 92 | 0.95 | 11 | 1590 | 68 |
|   | sta | 16 | 80 | 1.13 | 8 | 4417 | 53 |
| D | inv | 13 | 100 | 0.77 | 7 | 2357 | 58 |
|   | sta | 1 | 58 | 1.15 | 7 | 8659 | 32 |
| E | inv | 14 | 99 | 0.84 | 6 | 1963 | 60 |
|   | sta | 6 | 51 | 1.08 | 6 | 3959 | 48 |
| F | inv | 13 | 86 | 1.08 | 13 | 1963 | 65 |
|   | sta | 4 | 57 | 1.13 | 13 | 5026 | 62 |
| G | inv | 14 | 96 | 0.97 | 8 | — | — |
|   | sta | 12 | 78 | 0.97 | 8 | — | — |

What is claimed is:

1. A process for preparing a flexographic printing plate consisting essentially of in order (a) exposing imagewise with actinic radiation a photopolymerizable printing plate comprising a support; a solid photopolymerizable layer; and a cover layer wherein the imagewise exposure occurs from the cover layer side of the photopolymerizable printing plate and wherein the solid photopolymerizable layer comprises
      (i) at least one polymeric binder selected from the group consisting of thermoplastic, elastomeric block copolymers, polybutadiene and polyisoprene;
      (ii) at least one ethylenically unsaturated compound that can be addition-polymerized upon exposure to actinic radiation, and
      (iii) a photoinitiator or photoinitiator system,
   (b) overall exposure the photopolymerizable printing plate from the support side with actinic radiation to form a base;
   (c) removing non-imagewise exposed areas of the photopolymerizable layer by wash-out development to produce a flexographic printing plate; and
   (d) drying the flexographic printing plate produced in step (c) to produce an imagewise exposed, developed and dried flexographic printing plate.

2. The process according to claim 1, wherein the thickness of the photopolymerizable printing plate is less than 6 mm.

3. The process according to claim 1, wherein after step (d), the flexographic printing plate is (i) post exposed to improve ozone resistance or (ii) post-treated chemically to eliminate surface tackiness or both (i) and (ii).

4. The process according to claims 1 or 2, wherein the photopolymerizable layer contains less than 5% by weight of a non-crosslinkable plasticizer.

5. The process according to claim 4 wherein the cover layer is removed before the imagewise exposure to actinic radiation.

6. The process according to claims 1 or 2, wherein the cover layer is removed before the imagewise exposure to actinic radiation.

\* \* \* \* \*